(12) United States Patent
Choi

(10) Patent No.: US 7,989,284 B2
(45) Date of Patent: Aug. 2, 2011

(54) DRAM CELL TRANSISTOR DEVICE AND METHOD

(75) Inventor: JoBong Choi, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 236 days.

(21) Appl. No.: 12/238,521

(22) Filed: Sep. 26, 2008

(65) Prior Publication Data

US 2009/0152608 A1   Jun. 18, 2009

(30) Foreign Application Priority Data

Dec. 13, 2007   (CN) .......................... 2007 1 0094551

(51) Int. Cl.
*H01L 27/108* (2006.01)
*H01L 21/8242* (2006.01)

(52) U.S. Cl. ........ 438/239; 438/186; 438/238; 438/276; 438/653; 257/272; 257/296; 257/E27.084; 257/E21.647; 257/E21.061

(58) Field of Classification Search .................. 257/296, 257/311, 272, E27.084, E21.647, E29.265, 257/E21.061, E21.4; 438/239, 186, 276, 438/653, 238

See application file for complete search history.

(56) References Cited

U.S. PATENT DOCUMENTS

| 5,861,334 A | 1/1999 | Rho |
| 2001/0054734 A1 | 12/2001 | Koh et al. |
| 2008/0272408 A1* | 11/2008 | Vora .............................. 257/272 |

OTHER PUBLICATIONS

Office Action of Chinese Application No. 200710094551.9 dated Dec. 4, 2009, 5 pages total (English translation not included).

* cited by examiner

*Primary Examiner* — Evan Pert
*Assistant Examiner* — Whitney Morre
(74) *Attorney, Agent, or Firm* — Kilpatrick Townsend and Stockton LLP

(57) ABSTRACT

A method for forming a memory device. The method provides a protective layer overlying a surface region of a substrate before threshold voltage implant. The method then includes depositing a photo resist layer and patterning the photo resist by selectively removing a portion of the photo resist to expose the protective layer overlying a first region while maintaining the photo resist overlying a second region. The method includes implanting impurities for threshold voltage adjustment into the first region while the second region is substantially free of the impurities for threshold voltage adjustment. The method also includes forming a source region and a drain region. The method further includes providing a conductive structure over the source region. A junction between the conductive structure and the source region is substantially within the second region. The method then provides a storage capacitor in electrical contact with the source region via the conductive structure.

13 Claims, 2 Drawing Sheets

DRAM CELL TRANSISTOR DEVICE AND METHOD

CROSS-REFERENCES TO RELATED APPLICATIONS

This application claims priority to Chinese Patent Application No. 200710094551.9, filed Dec. 13, 2007, commonly assigned, and incorporated by reference herein for all purposes.

BACKGROUND OF THE INVENTION

The present invention is directed to integrated circuits and their processing for the manufacture of semiconductor devices. More particularly, the invention provides a method and device for manufacturing a low-leakage contact in an MOS transistor device structure. Merely by way of example, the invention has been applied to dynamic random access memory devices, commonly called DRAMs. But it would be recognized that the invention has a much broader range of applicability. For example, the invention can be applied to transistors in other MOS circuits that are susceptible to performance degradation caused by leakage current.

Integrated circuits have evolved from a handful of interconnected devices fabricated on a single chip of silicon to millions of devices. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. Making devices smaller is very challenging, as each process used in integrated circuit fabrication has a limit. That is to say, a given process typically only works down to a certain feature size, and then either the process or the device layout needs to be changed.

An example of such a process is the manufacture of cell devices for DRAMs. Such process includes, among others, those for the memory array in stack based capacitors and trench based capacitors. Such process also includes forming a contact between a transistor and a memory cell. The leakage current in such contact regions can cause charge loss in the DRAM cell and shorten the time between refresh operations. Additionally, cell transistor regions are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

The present invention provides techniques for the manufacture of semiconductor devices. More particularly, the invention provides a method and device for manufacturing a low-leakage contact in an MOS transistor device structure. Merely by way of example, the invention has been applied to dynamic random access memory devices, commonly called DRAMs. But it would be recognized that the invention has a much broader range of applicability. For example, the invention can be applied to transistors in other MOS circuits that are susceptible to performance degradation caused by leakage current.

According to an embodiment of the present invention, a method is provided for forming a memory device. The method includes providing a substrate including a surface region, forming a well structure within the substrate, and forming isolation regions within the well structure. The method provides a protective layer overlying the surface region which extends over the well structure. The method then deposits a photo resist layer overlying the protective layer, and patterns the photo resist by selectively removing a portion of the photo resist to expose the protective layer overlying a first region while maintaining the photo resist overlying a second region. The method also includes implanting impurities for threshold voltage adjustment into the first region using the patterned photo resist as a mask, and maintaining the second region substantially free of the impurities for threshold voltage adjustment. After the threshold voltage implant, the photoresist mask is removed. Then a gate dielectric layer is grown to overlie the surface region which extends over the well structure. The method then forms a gate stack over the gate dielectric layer. The gate stack can include a silicide layer overlying a polysilicon layer. This is followed by implanting impurities into the substrate using the gate stack as a mask to form lightly doped drain (LDD) structures, and then forming spacers on sides of the gate stack. The method then forms a source region and a drain region, and provides a contact structure over the source region. A junction between the contact structure and the source region is substantially within the second region. The method also includes providing a charge storage capacitor, which is in electrical contact with the source region via the contact structure. In a specific embodiment of the invention, the first region includes a plurality of disjoint regions. In another embodiment, the second region includes a plurality of disjoint regions.

Another embodiment of the invention provides a semiconductor integrated circuit apparatus which includes a substrate comprising a surface region and a well structure within the substrate. In an embodiment, the well structure includes a first region and a second region. The first region is characterized by impurities for threshold voltage adjustment, whereas the second region is substantially free of impurities for threshold voltage adjustment. The apparatus also includes isolation regions within the well structure, a gate dielectric layer overlying the surface region, and a gate stack overlying the gate dielectric layer. The gate stack can include a silicide layer overlying a polysilicon layer. The apparatus also includes LDD structures, spacers on sides of each of the gate stacks, and a source region and a drain region for each the gate stack. The apparatus further includes a contact structure over the source region, and a junction between the contact structure and the source region is substantially within the second region. In a specific embodiment of the invention, the first region includes a plurality of disjoint regions. In another embodiment, the second region includes a plurality of disjoint regions.

In an alternative embodiment, the invention provides a DRAM memory cell device which includes a substrate and a plurality of isolation regions formed in the substrate. The DRAM memory device also includes a P-well region formed in the substrate which is characterized by p-type dopants of a first concentration. The DRAM memory device also includes a channel region in the P-well region, and the channel region is characterized by p-type dopants of a second concentration. In an embodiment, the second concentration is higher than the first concentration. The DRAM memory device also includes an N-type drain region formed in the P-well region and adjacent to the channel region, and an N-type source region formed in the P-well region and adjacent to the channel region. A conductive structure forms a contact with the source region, where the source region is characterized by p-type dopants of the first concentration. The DRAM memory device also includes a charge storage capacitor electrically coupled to the conductive structure. In an embodiment, the P-type dopants of the second concentration comprise impurities for threshold voltage adjustment. In a specific embodiment, the junction region is substantially free of impurities for threshold implant.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. The resulting DRAM memory devices can exhibit improved device characteristics. In particular, lower leakage current, reduced contact resistance, and longer time between cell refresh operations have been demonstrated. Depending upon the embodiment, one or more of these benefits may be achieved. These and other benefits will be described in more details throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
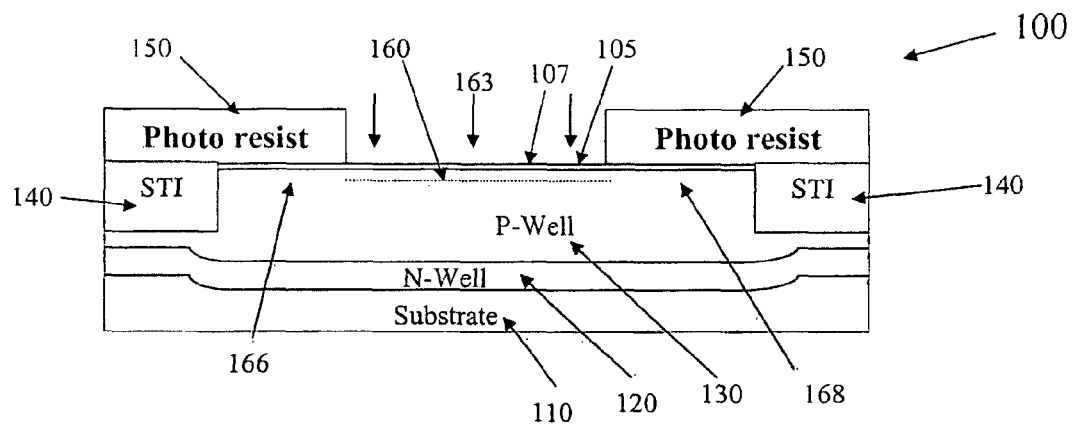
FIG. 1 is a simplified drawing illustrating a method for fabricating a DRAM memory device according to an embodiment of the present invention.

According to the present invention, techniques directed to the manufacture of semiconductor devices are provided. More particularly, the invention provides a method and device for manufacturing a low-leakage contact structure in an MOS transistor device. Merely by way of example, the invention has been applied to dynamic random access memory devices, commonly called DRAMs. But it would be recognized that the invention has a much broader range of applicability. For example, the invention can be applied to transistors in other MOS circuits that are susceptible to performance degradation caused by leakage current.

Depending upon the embodiment, the present invention includes various features, which may be used. These features include the following:

1. Threshold voltage adjustment ion implantation including a mask to prevent threshold implant in storage node contact regions.
2. Threshold voltage adjustment ion implantation including a mask to allow threshold implant in transistor channel regions.

As shown, the above features may be in one or more of the embodiments to follow. These features are merely examples, which should not unduly limit the scope of the claims herein. One of ordinary skill in the art would recognize many variations, modifications, and alternatives.

A method for fabricating an integrated circuit device according to an embodiment of the present invention may be outlined as follows:

1. Provide substrate, e.g., silicon substrate;
2. Form isolation regions, such as shallow trench isolation regions, within the substrate;
3. Form N-well region;
4. Form P-well region within the N-well region;
6. Form dielectric layer over the P-well and N-well regions;
7. Deposit and pattern a masking layer, such as a photo resist layer, to expose regions for threshold voltage adjustment implant;
8. Implant p-type ions, such as boron, for threshold adjustment;
9. Form gate dielectric layer, e.g. oxide, nitrided oxide, or combinations of dielectrics;
10. Form gate stack, which may include combinations of polysilicon layer, silicide layer, and other metal layers. The gate stack may be capped by dielectric layers;
11. Form lightly doped drain (LDD) regions;
12. Form spacers on sides of the gate stack;
13. Form doped source and drain regions;
14. Deposit conductor material, such as polysilicon or tungsten to form contact structures, such as contact plugs, with the source and drain regions. The contact structure can include optional layers for improved adhesion and reduced contact resistance;
15. Form charge storage capacitor in contact with the conductor structure;
16. Form devices for peripheral circuits;
17. Perform backend processes including dielectrics, planarization, interconnect formation, etc.

As shown, the method uses a combination of steps including a way of forming a DRAM memory device according to embodiments of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 2:
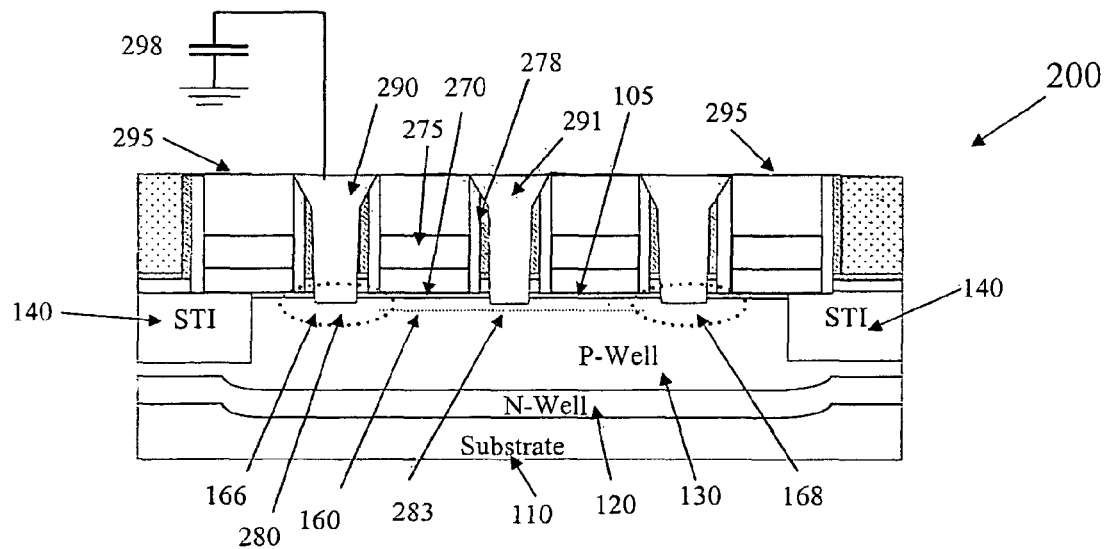
FIG. 2 is a simplified cross section view diagram of a DRAM memory device structure according to an embodiment of the present invention.

FIGS. 1 and 2 are simplified drawings illustrating a method and device structure for fabricating DRAM memory according to an embodiment of the present invention. These diagrams are merely examples, which should not unduly limit the scope of the claims herein. One of ordinary skill in the art would recognize many variations, alternatives, and modifications. As shown in FIG. 1, the method includes providing a substrate 110, e.g., silicon substrate, which includes a surface region 105. The method includes forming an N-type well structure 120 within substrate 110. The method also includes forming a P-type well structure 130 within the N-type well structure 120. The N-type well 120 includes phosphorus or arsenic based impurities, and the P-type well 130 includes boron based impurities or the like.

Referring to FIG. 1, isolation regions 140, e.g. shallow trench isolation regions, are formed for device isolation. The method includes forming a protective dielectric layer 107 (e.g., silicon dioxide, nitride, silicon oxynitride) overlying the surface region 105, which extends over the well region as shown. The silicon dioxide is often formed using a thermal oxidation process to form high quality gate oxide, which is substantially free from voids. A photo resist layer 150 is then deposited and patterned so as to allow threshold voltage implantation into transistor channel regions 160. This is followed by ion implantation of P-type impurities 163 to adjust a threshold voltage of a memory cell transistor. In a specific embodiment, the ion implantation can include impurities such as boron at a dose of approximately $2-5\times10^{11}/cm^2$ or $10^{12}/cm^2$. Here a purpose of the dielectric layer 107 is used to protect the silicon surface during the photo resist masking and implantation processes. After threshold adjustment implant, the method includes removing the photo resist and the protective dielectric layer. The above mentioned photo resist masking step is used to prevent threshold voltage adjustment implantation into certain regions, e.g., regions 166 and 168, in P-well 130. As will be discussed later, an electrical contact will be formed between region 166 and a conducting structure which is electrically coupled to a charge storage capacitor. Depending upon the embodiment, there can be other variations, modifications, and alternatives.

FIG. 2 is a simplified cross section view diagram of a DRAM memory cell device structure 200 fabricated according to an embodiment of the present invention. Memory cell device structure 200 includes certain device structures provided in the steps illustrated in FIG. 1. For example, silicon substrate 110 includes a surface region 105, an N-type well structure 120 within substrate 110, and a P-type well structure 130 within the N-type well structure 120. Memory cell device structure 200 also includes isolation regions 140 and transistor channel region 160 which received threshold voltage implant as described in FIG. 1. Memory cell device structure 200 also includes regions 166 and 168 which were protected by a photo resist mask and avoided threshold voltage implant as described above with reference to FIG. 1. According to an embodiment of the present invention, the method continues with forming a gate dielectric layer 270 on the silicon surface 105. The gate dielectric layer 270 may be, but not limited to, silicon dioxide, nitrided oxide, oxynitride, or nitride, etc. Silicon dioxide is often formed using a thermal oxidation process to form high quality gate oxide, which is substantially free from voids. A nitrided oxide can provide improved reliability and may be formed by introducing a nitrogen containing gas during the thermal oxidation process. The method also includes forming a gate stack 275, which may include a combination of conductive materials, such as doped polysilicon layer, silicide layer, and other metal layers. The gate stack may be capped by a dielectric layer, such as oxide, nitride, or a combination of dielectrics for planarization purposes. The various layers of gate stack materials are deposited and then patterned to form gate stack 275.

In a specific embodiment, the method also includes forming lightly doped drain (LDD) regions (not shown) by implanting N-type dopants, such as arsenic or phosphorus using the gate stack 275 as a self-aligned mask. Spacers, e.g. 278, are then formed on the sides of the gate stack 275 by depositing a dielectric layer of silicon oxide, nitride, or a combination of dielectrics, followed by an anisotropic etching process. Subsequently, source 280 and drain 283 regions are formed by ion implantation of N-type dopants such as arsenic or phosphorus with a dose of approximately $1-7\times10^{15}/cm^2$ using the gate stack and spacers as a self-aligned mask.

The methods then forms a contact plug structure 290 by depositing a conductive material, such as doped polysilicon or tungsten, into the void regions between dielectrics, such as spacer region 278. The conductive material may also include additional layers to improve contact resistance and adhesion. The conductive material is then planarized by etch back or chemical mechanical polishing (CMP). The resulting structure is a planarized surface 295 of dielectrics above the substrate surface 105, with embedded regions of exposed contact plug structures such as 290. As shown schematically in FIG. 2, a charge storage capacitor 298 is then formed and is electrically connected to contact plug structure 290. In a specific embodiment the charge storage capacitor 298 is formed as an metal-insulator-metal (MIM) capacitor above the planarized surface. However, other capacitor structures, such as a metal-dielectric-substrate capacitor or a trench capacitor, can also be used. Depending upon the embodiment, one of ordinary skill in the art would recognize other variations, modifications, and alternatives.

As shown in FIG. 2, contact plug structure 290 forms an electrical connection between a charge storage capacitor 298 and a source region 280 of memory cell device 200. Contact plug structure 291 connects a drain region 283 of memory cell device 200 to a sensing circuit (not shown) to enable reading out the data in charge storage capacitor 298. In an embodiment, the boron doping concentration in the P-well region adjacent to the substrate surface region 105 is approximately $1-7\times10^{15}/cm^3$, whereas channel region 160 of memory cell device 200 has a boron doping concentration of approximately $1-6\times10^{16}/cm^2$ as a result of additional dopants from threshold voltage implant. Source region 280 is typically heavily doped with N-type dopants, e.g. arsenic or phosphorus, with a concentration of approximately $1-7\times10^{18}/cm^3$. Source region 280 also contains boron doping of P-well of approximately $1-7\times10^{15}/cm^3$. According to an embodiment of the invention, a junction is formed between contact plug 290 structure and source region 280 in region 166 which is masked out during threshold voltage implant. Therefore, region 166 is characterized by a P-well doping concentration as described above, i.e. $1-7\times10^{15}/cm^3$. In a particular embodiment, the drain region 283 includes N-type dopants similar to the source region 163, and also receives a threshold implant of P-type dopants. In an alternative embodiment, threshold hold implant may be excluded from a drain region by photo resist masking. Depending upon the embodiment, other variations, modifications, and alternatives may be used.

As is known, leakage current can occur at the junction between a heavily doped N-type source region and a P-type region. When such a junction is included in a DRAM cell structure, such as source region 280 in FIG. 2, DRAM memory cell performance can be adversely impacted. Experimental results have shown that the conventional method of introducing threshold adjustment implant into a source contact region can cause increased leakage current and shortened charge retention time of the DRAM cell. In addition, contact resistance can also be increased by threshold implant. Our experimental data indicate that methods according the present invention lead to substantial improvements in leakage current, contact resistance, and data retention time. The experimental results are shown in the following table.

TABLE I

|  | Leakage Current (pA) | Contact Resistance (Ohms) | Data Retention Time (msec) |
|---|---|---|---|
| Conventional Cell | 0.044-4.3 | 580K | 180-220 |
| This invention | 0.042-1.5 | 460K | 200-240 |

As can be seen in Table I, in devices fabricated according to an embodiment of the present invention, the maximum measured leakage current is reduced from 4.3 to 1.5 pA, contact resistance is lowered by about 20%, and charge retention time is increased by about 10%. As a result of improved charge retention time, the time between cell charge refresh operations is also extended.

Figure 3:
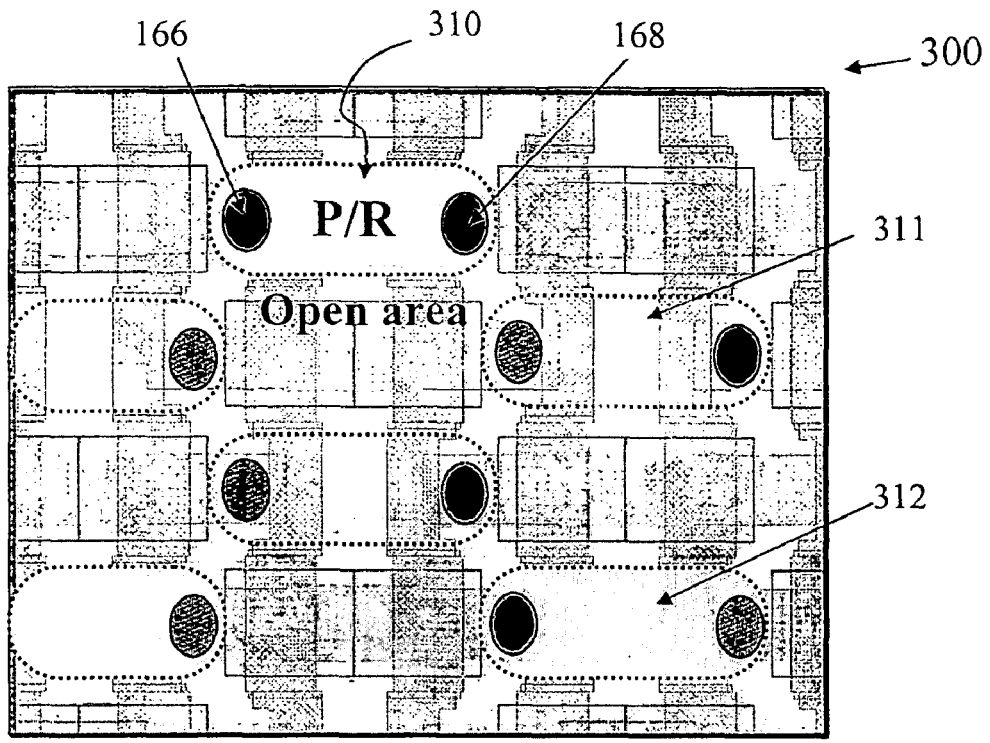
FIG. 3 is a simplified diagram of a mask layout according to an embodiment of the present invention.
Figure 4:
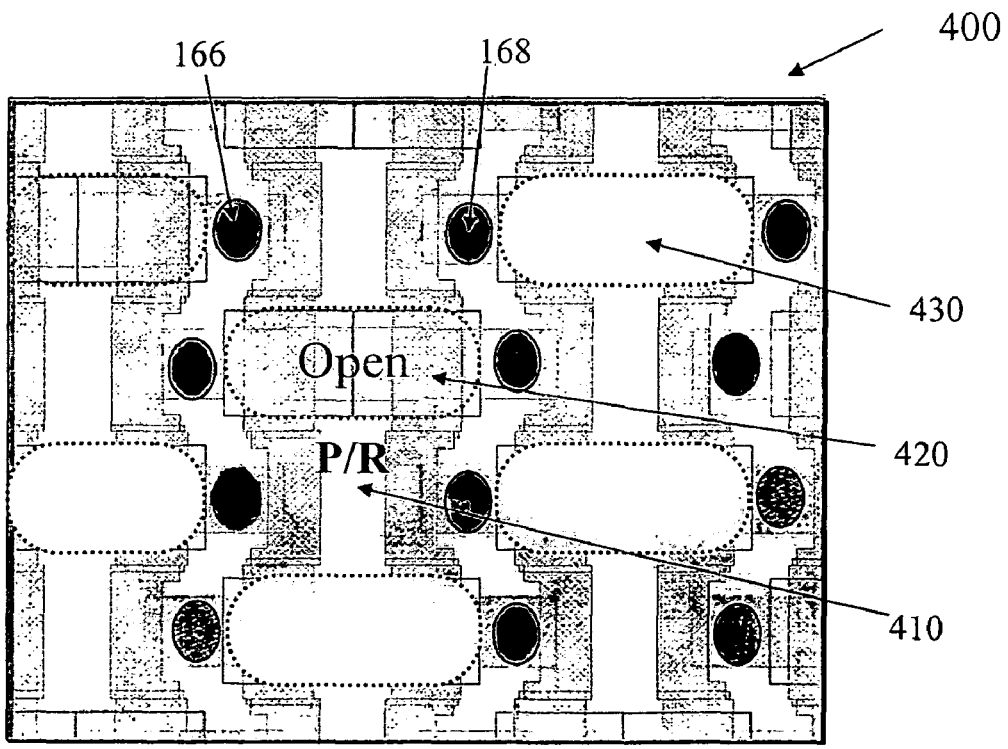
FIG. 4 is a simplified diagram of a mask layout according to an alternative embodiment of the present invention.

Referring back to FIG. 1, the method according an embodiment of the invention includes using a photo resist mask that prevents threshold implant into storage cell contact areas 166 and 168. Various photo resist mask designs can be used for threshold voltage implant. For example, in an embodiment a separate masked region is used for each storage cell contact area. Alternatively, in another specific embodiment, a threshold implant mask pattern 300 is shown in FIG. 3. A masked region 310 covers two contact areas 166 and 168 to prevent threshold implant into these contact areas. A number of disjoint photo resist mask regions, such as 310, 311, and 312, are repeated in the DRAM cell areas as shown in FIG. 3. In yet another specific embodiment, as shown in a mask pattern in FIG. 4, a photo resist layer 410 covers most of the memory cell area, leaving unmasked regions, e.g., 420 to allow threshold voltage implant. Area 420 includes, for example, transistor channel regions. Here disjoint windows in the photo resist, such as 420 and 430, are repeated in the cell area to allow threshold implant. Depending upon the embodiment, one of ordinary skill in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a memory device, the method comprising:
    providing a substrate comprising a surface region;
    forming a well structure within the substrate;
    forming isolation regions within the well structure;
    providing a protective layer overlying the surface region, the surface region extending over the well structure;
    depositing a photo resist layer overlying the protective layer;
    patterning the photo resist by selectively removing a portion of the photo resist to expose the protective layer overlying a first region while maintaining the photo resist overlying a second region;
    implanting impurities for threshold voltage adjustment into the first region using the patterned photo resist as a mask;
    maintaining the second region substantially free of the impurities for threshold voltage adjustment;
    removing the photo resist mask;
    providing a gate dielectric layer overlying the surface region;
    forming a gate stack over the gate dielectric layer, the gate stack comprising a silicide layer overlying a polysilicon layer;
    implanting impurities into the substrate using the gate stack as a mask to form lightly doped drain (LDD) structures;
    providing spacers on sides of the gate stack;
    forming a source region and a drain region;
    providing a contact structure over the source region, a junction region between the contact structure and the source region being substantially within the second region; and
    providing a charge storage capacitor, the capacitor being in electrical contact with the source region via the contact structure.

2. A method for forming a memory device as recited in claim 1, wherein forming a well structure comprises forming a P-well structure within the substrate.

3. A method for forming a memory device as recited in claim 2, wherein forming a well structure comprises:
    forming an N-well structure within the substrate; and
    forming a P-well structure within the N-well structure.

4. The method of claim 1 wherein implanting impurities into the first region comprises implanting boron-containing impurities.

5. The method of claim 1 wherein forming isolation regions comprises forming shallow trench isolation regions.

6. The method of claim 1 wherein forming a gate stack comprises:
    depositing a polysilicon layer over the gate oxide;
    depositing a metal layer overlying the polysilicon layer;
    forming a silicide layer; and
    patterning the silicide layer and the polysilicon layer.

7. The method of claim 6, wherein forming a source region and a drain region comprises:
    implanting N-type impurities into the substrate using the patterned gate stack as a mask.

8. The method of claim 1, wherein providing a contact structure comprises:
    depositing a conductive material into void regions between the spacers on sides of the gate stack; and
    planarizing the conductive material.

9. The method of claim 8, wherein providing a charge storage capacitor comprises a metal-insulator-metal capacitor over a surface area of the planarized conductive material.

10. The method of claim 8, wherein providing a charge storage capacitor comprises a metal-dielectric-substrate capacitor.

11. The method of claim 8, wherein providing a charge storage capacitor comprises a trench capacitor.

12. The method of claim 1, wherein patterning the photo resist comprises generating a plurality of disjoint masked regions on the surface region.

13. The method of claim 1, wherein patterning the photo resist comprises generating a plurality of disjoint open regions on the surface region.

* * * * *